United States Patent
Lin et al.

(10) Patent No.: US 7,514,299 B2
(45) Date of Patent: Apr. 7, 2009

(54) CHIP PACKAGE STRUCTURE AND MANUFACTURING METHOD THEREOF

(75) Inventors: Chun-Hung Lin, Tainan County (TW); Shih-Wen Chou, Tainan County (TW); Yu-Tang Pan, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 119 days.

(21) Appl. No.: 11/530,165

(22) Filed: Sep. 8, 2006

(65) Prior Publication Data

US 2008/0017961 A1  Jan. 24, 2008

(30) Foreign Application Priority Data

Jul. 20, 2006  (TW) .............................. 95126496 A

(51) Int. Cl.
H01L 21/44 (2006.01)
H01L 21/48 (2006.01)

(52) U.S. Cl. .................. 438/126; 439/127; 439/617; 257/787; 257/E23.116

(58) Field of Classification Search ................ 438/127, 438/617, 112, 124, 126; 257/787, 784, E23.116
See application file for complete search history.

(56) References Cited

U.S. PATENT DOCUMENTS

| | | | | |
|---|---|---|---|---|
| 5,920,118 A | * | 7/1999 | Kong | 257/684 |
| 6,048,755 A | * | 4/2000 | Jiang et al. | 438/118 |
| 6,144,102 A | * | 11/2000 | Amagai | 257/781 |
| 6,291,274 B1 | * | 9/2001 | Oida et al. | 438/123 |
| 6,379,888 B1 | * | 4/2002 | Nadeau et al. | 435/6 |
| 6,692,987 B2 | * | 2/2004 | Lim et al. | 438/106 |
| 6,987,058 B2 | * | 1/2006 | Hall | 438/617 |
| 7,122,407 B2 | * | 10/2006 | Kim et al. | 438/127 |
| 7,273,769 B1 | * | 9/2007 | Brand | 438/122 |
| 2005/0208707 A1 | * | 9/2005 | Kim et al. | 438/113 |

* cited by examiner

Primary Examiner—Nitin Parekh
(74) Attorney, Agent, or Firm—J.C. Patents

(57) ABSTRACT

A manufacturing method of a chip package structure is provided. A circuit substrate having a first surface, a second surface, and a through hole connecting the first surface and the second surface is provided. A chip having an active surface and bonding pads disposed on the active surface is provided. The chip is fixed on the circuit substrate, wherein the second surface is opposite to the active surface and the bonding pads are exposed to the through hole. Bonding wires connecting the bonding pads and the first surface are formed through the through hole. A film having an opening is formed on the first surface. The bonding wires, the bonding pads, the through hole, and part of the first surface are exposed by the opening. An encapsulant is formed to encapsulate part of the active surface, the bonding wires, and part of the first surface. The film is removed.

5 Claims, 4 Drawing Sheets

CHIP PACKAGE STRUCTURE AND MANUFACTURING METHOD THEREOF

CROSS-REFERENCE TO RELATED APPLICATION

This application claims the priority benefit of Taiwan application serial no. 95126496, filed on Jul. 20, 2006. All disclosure of the Taiwan application is incorporated herein by reference.

BACKGROUND OF THE INVENTION

1. Field of the Invention

The present invention relates to a semiconductor device and a manufacturing method thereof, and more particularly, to a chip package structure and a manufacturing method thereof.

2. Description of Related Art

The production of IC devices can be mainly divided into three stages, including IC design, IC process and IC package.

During the IC process, a chip is fabricated by the steps of wafer process, IC formation and wafer sawing and so on. A wafer has an active surface, which generally means the surface comprising active devices. After the IC on the wafer is formed, the active surface of the wafer further includes a plurality of bonding pads so that the chip formed by wafer sawing can be externally electrically connected to a carrier through the bonding pads. The carrier may be a lead frame or a package substrate. The chip can be connected to the carrier by wire bonding or flip chip bonding, so that the bonding pads on the chip are electrically connected to the contact pads of the carrier, thereby forming a chip package structure.

FIG. 1 is a schematic cross-sectional view of a conventional chip package structure. The conventional chip package structure 100 includes a circuit substrate 110, a chip 120, a plurality of bonding wires 130, an encapsulant 140 and a plurality of solder balls 150. The circuit substrate 110 has a first surface 112, a second surface 114 and a through hole 116. The through hole connects the first surface 112 and the second surface 114. Furthermore, the chip 120 has an active surface 122 and a plurality of bonding pads 124, wherein the bonding pads 124 are disposed on the active surface 122, and the second surface 114 of the circuit substrate 110 is opposite to the active surface 122 of the chip 120. The through hole 116 exposes the bonding pads 124.

The bonding wires 130 respectively connect the bonding pads 124 and the first surface of the circuit substrate 110, and the bonding wires 130 pass through the through hole 116. The encapsulant 140 encapsulates a part of the active surface 122, the bonding wires 130 and a part of the first surface 112. The encapsulant 140 has a top surface 142, a bottom surface 144 and a side wall 146 on the first surface 112. The top surface 142 of the encapsulant 140 is away from the first surface 112, and the bottom surface 144 is in contact with a part of the first surface 112. Besides, the area of the bottom surface 144 is larger than the area of the top surface 142, so that a draft angle θ is formed between the perpendicular line of the side wall 146 and the first surface 112.

In the molding process, the shape of the encapsulant 140 is the same as the shape of the mold cavity of the mold, and the function of the draft angle θ is to facilitate the encapsulated chip package structure 100 to be smoothly removed from the mold. Therefore, different sizes of chip package structures 100 require different shapes of the molds, which greatly increases the manufacturing cost of the molds. In addition, overflow may sometimes occur during the molding process, resulting in contamination of the first surface 112 of the circuit substrate 110.

SUMMARY OF THE INVENTION

One objective of the present invention is to provide a manufacturing method for a chip package structure, so as to alleviate overflow during the molding process.

Another objective of the present invention is to provide a chip package structure, which reduces the manufacturing cost of the molds during the molding process.

As embodied and broadly described herein, the present invention is directed to a method of manufacturing a chip package structure, which includes the following steps. First, a circuit substrate is provided. The circuit substrate includes a first surface, a second surface and a through hole connecting to the first surface and the second surface. Then, a chip is provided. The chip has an active surface and a plurality of bonding pads, wherein the bonding pads are disposed on the active surface. Next, the chip is fixed on the circuit substrate. The second surface of the circuit substrate and the active surface of the chip are opposite to each other, and the through hole exposes the bonding pads. Then, a plurality of bonding wires passing through the through hole is formed, and the bonding pads are electrically connected to the first surface of the circuit substrate through the bonding wires. After that, a film is formed on the first surface of the circuit substrate. The film has an opening, and the opening exposes the bonding wires, the bonding pads, the through hole and a part of the first surface. Next, an encapsulant is formed in the opening and the through hole to cover a part of the active surface, the bonding wires and a part of the first surface. The film is then removed.

In one embodiment of the present invention, the material of the film includes flexible film, such as polyimide.

In one embodiment of the present invention, the method of removing the film includes tearing-off.

According to one embodiment of the present invention, before the step of forming the encapsulant, a first mold and a second mold are provided, wherein a mold cavity is formed between the first mold and the second mold, and therefore the chip, the circuit substrate, the bonding wires and the film are disposed inside the mold cavity. In addition, the first mold presses on the film and covers the opening, and the second mold covers the chip and the second surface of the circuit substrate.

In one embodiment of the present invention, after the step of removing the film, the manufacturing method of the chip package structure further includes forming a plurality of solder balls on the first surface of the circuit substrate.

To achieve the described and other objectives, the present invention proposes a chip package structure, which includes a circuit substrate, a chip, a plurality of bonding wires and an encapsulant. The circuit substrate has a first surface, a second surface and a through hole connecting to the first surface and the second surface. The chip is disposed on the circuit substrate and has an active surface and a plurality of bonding pads. The bonding pads are disposed on the active surface, and the second surface of the circuit substrate and the active surface of the chip are opposite to each other. The through hole exposes the bonding pads. The bonding wires respectively connect the bonding pads and the first surface of the circuit substrate, and the bonding wires pass through the through hole. The encapsulant encapsulates a part of the active surface, the bonding wires and a part of the first surface. The encapsulant has a top surface and a bottom surface above the first surface. The top surface is away from the bottom surface, and is in contact with a part of the first surface. In addition, the absolute value of the ratio of half of the difference between the width of the top surface and the width of the bottom surface to the distance between the top surface and the bottom surface is smaller than or equal to 0.2.

In one embodiment of the present invention, the chip package structure further includes a plurality of solder balls which are disposed on the first surface of the circuit substrate.

In summary, in the present invention, before performing the molding process, a film is first formed on the first surface of the circuit substrate, thereby reducing the overflow during the molding process. Furthermore, as the film is used in the present invention, different sizes of chip package structures can utilize the same first mold, thus, the manufacturing cost of the molds is reduced. As a result, the manufacturing cost of the chip package structure of the present invention is lowered. In addition, since the film is removed after the molding process, the side wall of the chip package structure is substantially perpendicular to the first surface of the circuit substrate.

It is to be understood that both the foregoing general description and the following detailed description are exemplary, and are intended to provide further explanation of the invention as claimed.

DESCRIPTION OF EMBODIMENTS

Figure 1:
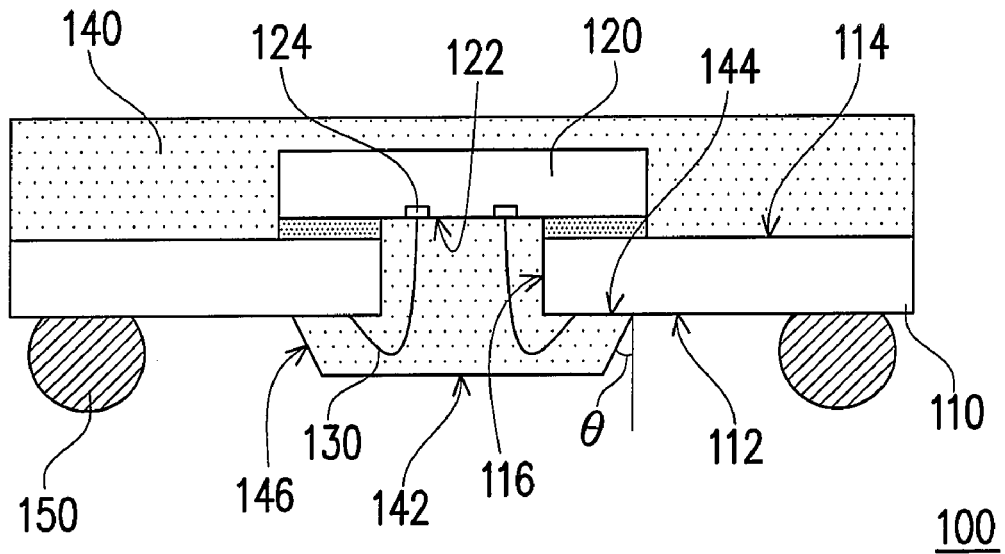
FIG. 1 is a cross sectional view showing a conventional chip package structure.
Figure 2:
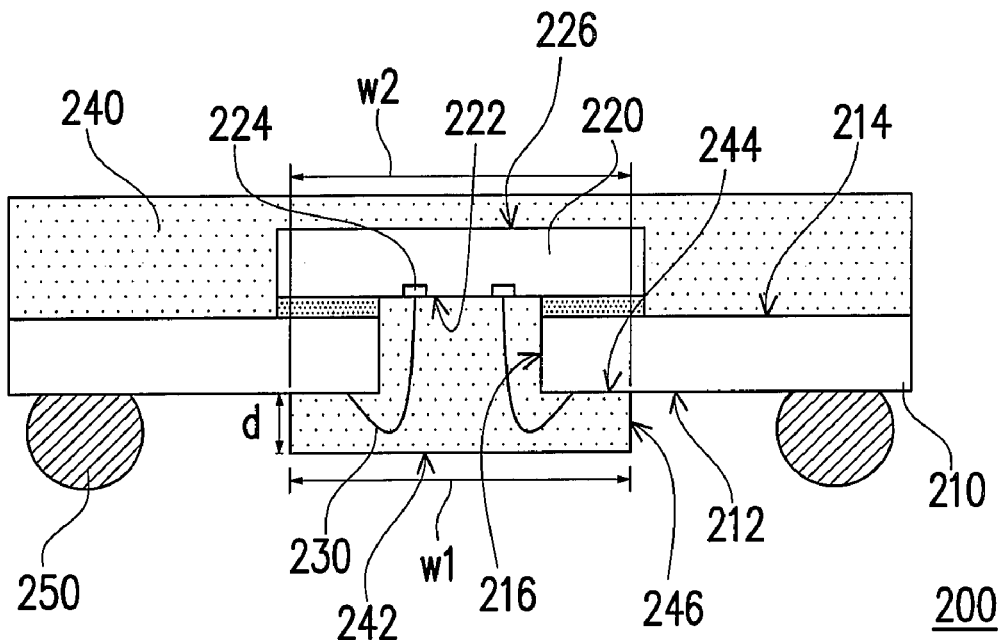
FIG. 2 is a cross sectional view showing a chip package structure according to an embodiment of the present invention.

Referring to FIG. 2, a cross sectional view showing a chip package structure according to an embodiment of the present invention is illustrated. The chip package structure 200 of the present embodiment includes a circuit substrate 210, a chip 220, a plurality of bonding wires 230 and an encapsulant 240. The circuit substrate 210 has a first surface 212, a second surface 214 and a through hole 216. The through hole 216 connects the first surface 212 and the second surface 214. The chip 220 is disposed on the circuit substrate 210 and has an active surface 222 and a plurality of bonding pads 224. The bonding pads 224 are disposed on the active surface 222, and the second surface 214 of the circuit substrate 210 and the active surface 222 of the chip 220 are opposite to each other. The through hole 216 exposes the bonding pads 224.

The bonding wires 230 respectively connect the bonding pads 224 and the first surface 212 of the circuit substrate 210, and the bonding wires 230 pass through the through hole 216. In addition, the bonding wires 230 are used as a medium for electrically connecting the chip 220 and the circuit substrate 210. Besides, the encapsulant 240 covers a part of the active surface 222, the bonding wires 230 and a part of the first surface 212. It can be seen from FIG. 2 that the encapsulant 240 further covers the second surface 214 of the circuit substrate 210 and the back surface 226 of the chip 220. It should be noted that the encapsulant 240 serves to protect the bonding wires 230 from being affected by the environmental moisture, heat or noise.

The encapsulant 240 has a top surface 242 and a bottom surface 244 above the first surface 212 of the circuit substrate 210. The top surface 242 of the encapsulant 240 is away from the first surface 212, and the bottom surface 244 is in contact with a part of the first surface 212. The absolute value of the ratio of half of the difference between the width w1 of the top surface 242 and the width w2 of the bottom surface 244 to the distance d between the top surface 242 and the bottom surface 244 is smaller than or equal to 0.2, and the mathematic formula can be presented as $|(w1-w2)/2d| \leq 0.2$. In other words, the side wall 246 of the encapsulant 240 is substantially perpendicular to the first surface 212 of the circuit substrate 210. In addition, in the embodiment, the chip package structure 200 further includes a plurality of solder balls 250 which are disposed on the first surface 212 of the circuit substrate 210, and the solder balls 250 are used for electrically connecting the next level of the devices (not shown).

Figure 3A:
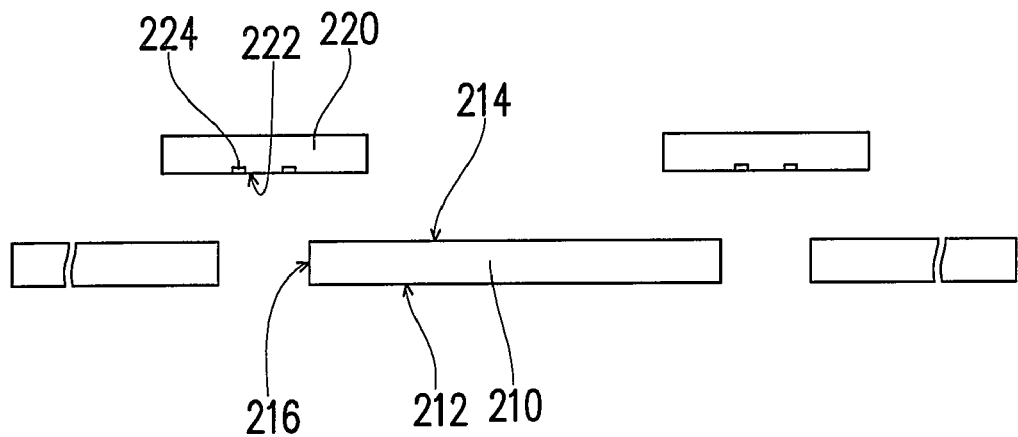
FIGS. 3A to 3H illustrate the steps of manufacturing the chip package structure according to an embodiment of the present invention.

The manufacturing method of the chip package structure 200 according to the present embodiment is described in detail in the following. FIGS. 3A to 3H illustrate the steps of manufacturing the chip package structure according to an embodiment of the present invention. The manufacturing method of the chip package structure 200 of the present embodiment includes the following steps. First, referring to FIG. 3A, a circuit substrate 210 is provided. The circuit substrate 210 has a first surface 212, a second surface 214 and at least a through hole 216 (only two through holes are shown in FIG. 3A). Each of the through holes 216 connects the first surface 212 and the second surface 214.

Next, at least a chip 220 is provided (only two chips are shown in FIG. 3A). Each of the chips 220 respectively has an active surface 222 and a plurality of bonding pads 224. The bonding pads 224 are disposed on the active surface 222. In addition, the active surface 222 of each of the chips 220 faces the second surface 214 of the circuit substrate 210.

Figure 3B:
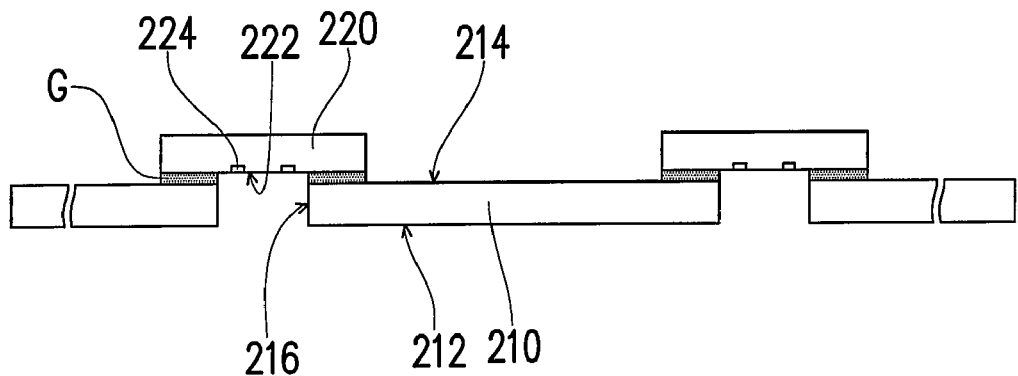

Referring to FIG. 3B, the chips 220 are fixed on the circuit substrate 210. The second surface 214 of the circuit substrate 210 and the active surface 222 of each of the chips 220 are opposite to each other, and the through holes 216 expose the bonding pads 224. In the embodiment, the chips 220 are fixed on the circuit substrate 210 by adhesive G.

Figure 3C:
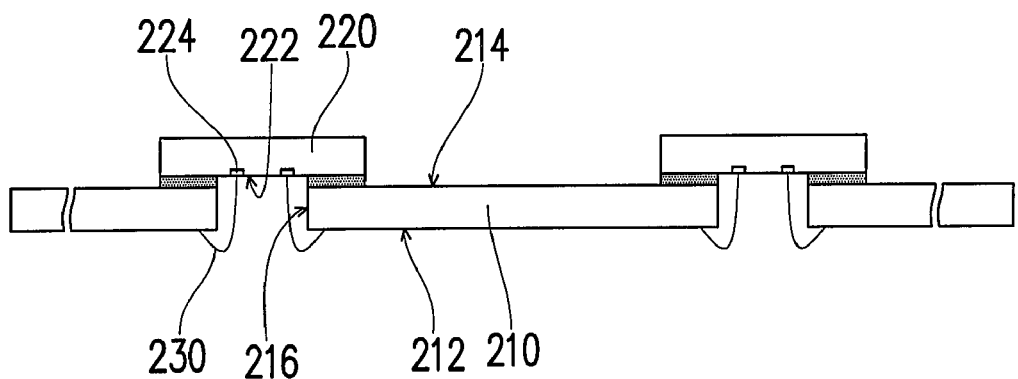

Referring to FIG. 3C, a plurality of bonding wires 230 passing the through holes 216 is formed, and the bonding pads 224 of each of the chips 220 are electrically connected to the first surface 212 of the circuit substrate 210 through the bonding wires 230. In other words, the bonding wires 230 are used as a medium for electrically connecting the chips 220 and the circuit substrate 210.

Figure 3D:
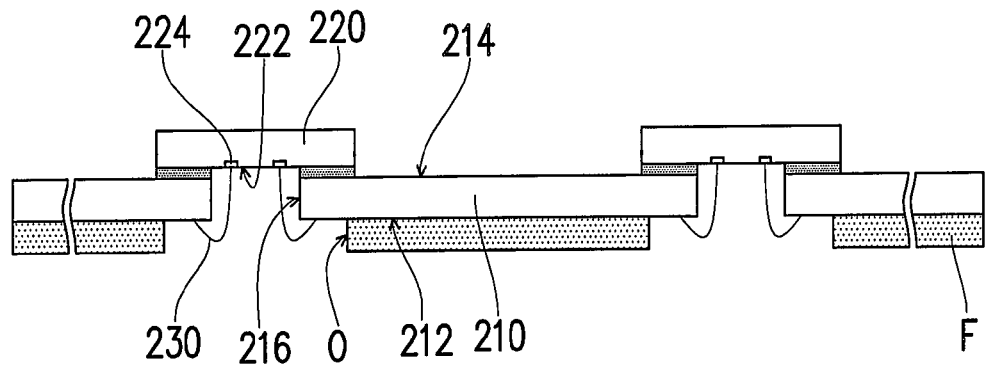

Referring to FIG. 3D, a film F is formed on the first surface 212 of the circuit substrate 210. The film F comprises at least an opening O (only two openings are shown in FIG. 3D), and the openings O expose the bonding wires 230, the bonding pads 224, the through holes 216 and a part of the first surface 212. In the embodiment, the material of the film F includes, for example, polyimide. The method of forming the film F can be by sticking.

Figure 3E:
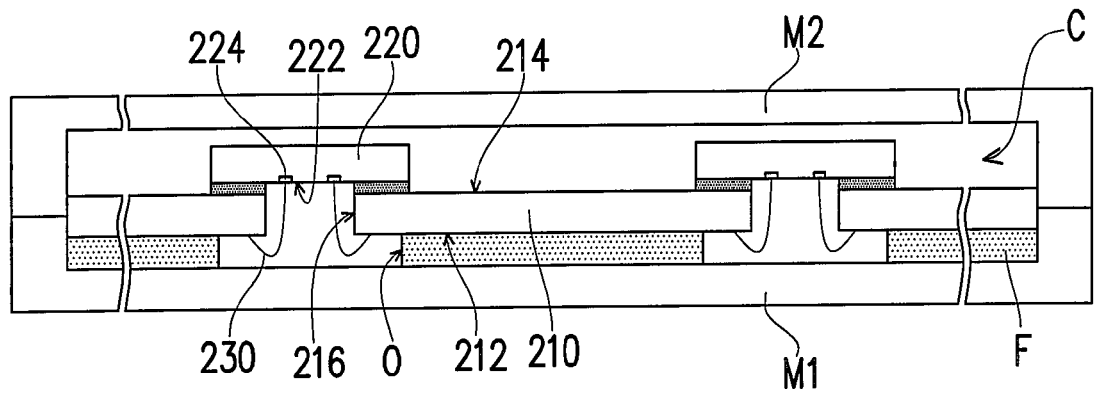

Referring to FIG. 3E, a first mold M1 and a second mold M2 are provided, wherein a mold cavity C is formed between the first mold M1 and the second mold M2, and therefore the chips 220, the circuit substrate 210, the bonding wires 230 and the film F are disposed inside the mold cavity C. Further, the first mold M1 presses on the film F and covers the openings O. The second mold M2 covers the chips 220 and the second surface 214 of the circuit substrate 210.

Figure 3F:
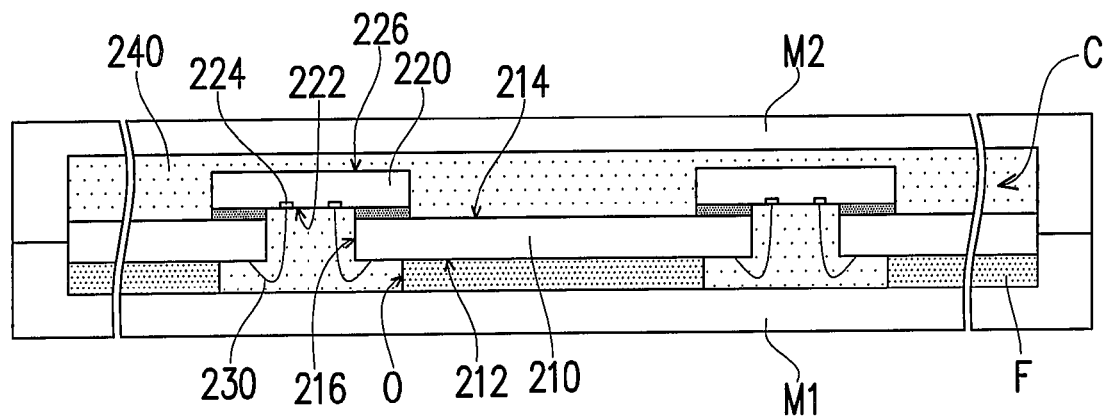

Referring to FIG. 3F, the molding process is carried out, i.e., an encapsulant 240 is formed in the openings O and the through holes 216, so as to cover a part of the active surface 222, the bonding wires 230 and a part of the first surface 212. The material of the encapsulant 240 is resin, for example. In the embodiment, the encapsulant 240 further covers the second surface 214 of the circuit substrate 210 and the back surface 226 of the chip 220. After the material of forming the encapsulant 240 is injected, a curing process is performed to form the encapsulant 240.

Figure 3G:
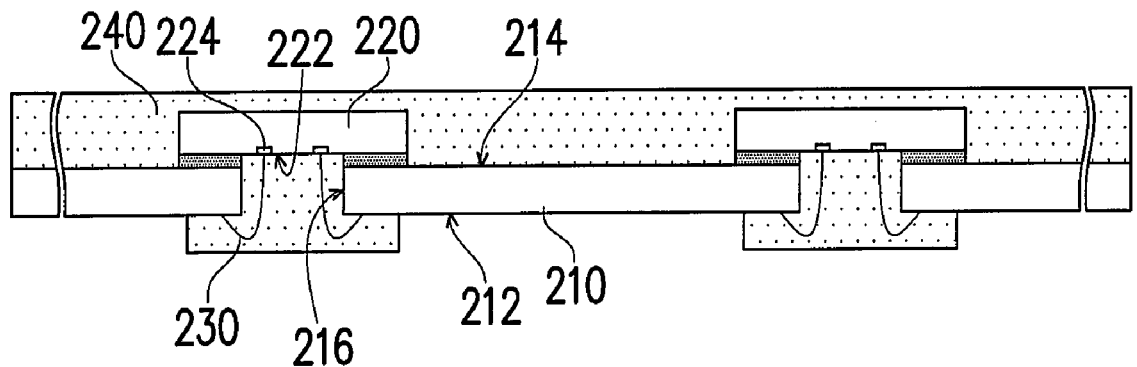

Referring to FIG. 3G, the first mold M1, the second mold M2 and the film F are removed. The method of removing the film F can be tearing-off, and the tearing-off step can be carried out by manpower or machinery automation.

Figure 3H:
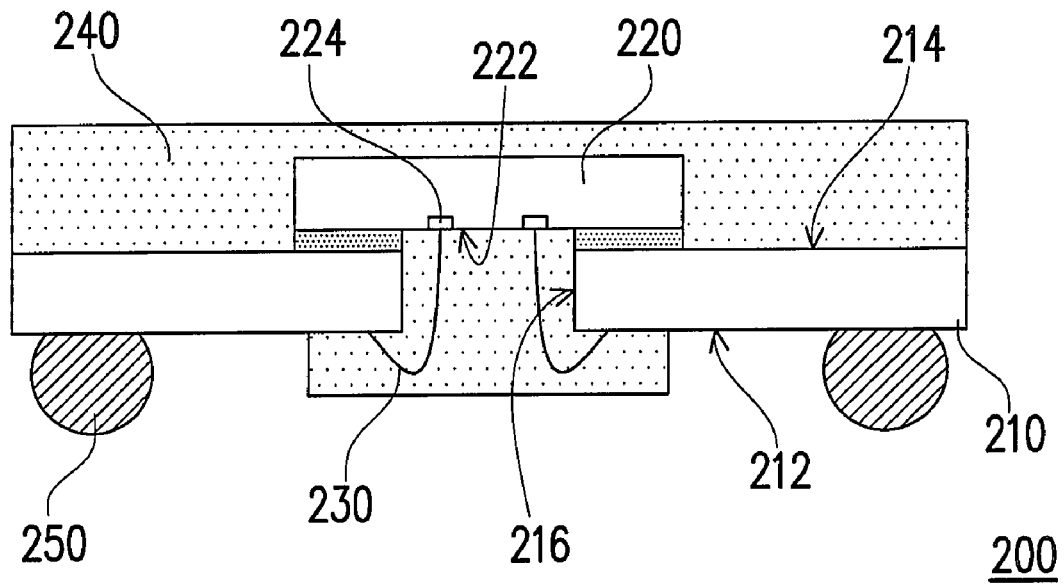

Referring to FIG. 3H, in the embodiment, a plurality of solder balls 250 is formed on the first surface 212 of the circuit substrate 210, and is used for electrically connecting the next level of the devices (not shown). The method of forming the solder balls includes using vacuum transfer or gravity transfer to dispose the raw material of the solder balls 250 at the predetermined location, and then performing a reflow process to form the solder balls. In addition, after the solder balls 250 are formed, a singulation process can be carried out to form a plurality of the chip package structure 200.

In summary, the present invention has at least the following advantages.

1. In the present invention, before performing the molding process, a film is first formed on the first surface of the circuit substrate, thereby reducing the occurrence of overflow during the molding process.

2. Different sizes of chip package structures can utilize the same mold only requiring changing the film thickness and the width of the opening(s), thus, the manufacturing cost of the molds is reduced. As a result, the manufacturing cost of the chip package structure of the present invention is lowered. In the aspect of the structure, since the film is removed after the molding process, the side wall of the chip package structure and the first surface of the circuit substrate are substantially perpendicular.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a chip package structure, comprising:

providing a circuit substrate, the circuit substrate has a first surface, a second surface and a through hole connecting to the first surface and the second surface;

providing a chip, the chip has an active surface and a plurality of bonding pads, wherein the bonding pads are disposed on the active surface;

fixing the chip on the circuit substrate, wherein the second surface of the circuit substrate and the active surface of the chip are opposite to each other, and the through hole exposes the bonding pads;

forming a plurality of bonding wires passing through the through hole, and the bonding pads are electrically connected to the first surface of the circuit substrate through the bonding wires;

sticking a flexible film on the first surface of the circuit substrate, wherein the flexible film has an opening, and the opening exposes the bonding wires, the bonding pads, the through hole and a part of the first surface;

forming an encapsulant in the opening and the through hole to cover a part of the active surface, the bonding wires and a part of the first surface; and removing the film.

2. The manufacturing method of the chip package structure as claimed in claim 1, the material of the film comprises polyimide.

3. The manufacturing method of the chip package structure as claimed in claim 1, the method of removing the film comprises tearing-off.

4. The manufacturing method of the chip package structure as claimed in claim 1, before forming the encapsulant, a first mold and a second mold are provided, wherein a mold cavity is formed between the first mold and the second mold, and therefore the chip, the circuit substrate, the bonding wires and the film are disposed inside the mold cavity, the first mold presses on the film and covers the opening, and the second mold covers the chip and the second surface of the circuit substrate.

5. The manufacturing method of the chip package structure as claimed in claim 1, after removing the film further includes forming a plurality of solder balls on the first surface of the circuit substrate.

* * * * *